United States Patent [19]

Ariyoshi et al.

[11] Patent Number: 4,845,044
[45] Date of Patent: Jul. 4, 1989

[54] PRODUCING A COMPOUND SEMICONDUCTOR DEVICE ON AN OXYGEN IMPLANTED SILICON SUBSTRATE

[75] Inventors: Hisashi Ariyoshi, Tokyo; Toru Kasanami, Kyoto; Susumu Fukuda, Osaka, all of Japan

[73] Assignee: Murata Manufacturing Co., Ltd., Japan

[21] Appl. No.: 239,337

[22] Filed: Jul. 28, 1988

[30] Foreign Application Priority Data

Jul. 29, 1987 [JP] Japan .................................. 62-193578

[51] Int. Cl.⁴ .................. H01L 21/20; H01L 21/265; H01L 21/36; H01L 21/425
[52] U.S. Cl. ........................................ 437/24; 437/26; 437/126; 437/132
[58] Field of Search ................... 437/24, 26, 126, 132; 148/DIG. 149, DIG. 64, DIG. 65, DIG. 72

[56] References Cited

U.S. PATENT DOCUMENTS

| 4,509,990 | 4/1985 | Vasudev | 437/26 |
| 4,774,205 | 9/1988 | Choi et al. | 437/59 |

FOREIGN PATENT DOCUMENTS

| 61-64119 | 4/1986 | Japan | 437/132 |
| 61-188927 | 8/1986 | Japan | 437/132 |

Primary Examiner—Olik Chaudhuri
Attorney, Agent, or Firm—Ostrolenk, Faber, Gerb & Soffen

[57] ABSTRACT

A production method for producing a semiconductor device by growing a crystalline compound semiconductor on a monocrystalline silicon substrate is comprised of a step for forming a transition domain varying from a monocrystalline silicon layer to a polycrystalline silicon layer in the silicon substrate by implanting oxygen ions into the silicon substrate and annealing the silicon substrate and a step for depositing a compound semiconductor layer on the silicon substrate.

6 Claims, 1 Drawing Sheet

- 6 GaAs monocrystal
- 5 Si monocrystal
- 3 Transition layer
- 2 SiO₂
- 4 Transition layer
- 1 Si substrate

PRODUCING A COMPOUND SEMICONDUCTOR DEVICE ON AN OXYGEN IMPLANTED SILICON SUBSTRATE

BACKGROUND OF THE INVENTION

1. Field of the Invention

The present invention relates to a production method for producing a semiconductor device by growing a crystalline compound semiconductor for forming a functional device on a surface of a substrate of monocrystalline silicon.

2. Description of the Prior Art

Generally speaking, the compound semiconductor such as GaAs has advantages in that it has a higher electron mobility and a wider width of the forbidden band when compared with the element semiconductor such as Si or Ge and that it has a direct band gap.

Various devices drivable at a high speed such as infrared-emitting diode, semiconductor laser, ultrasonic transducer, GaAs FET and the like have been developed by utilizing these advantages of the compound semiconductor.

Also, various attempts for producing high performance composite LSI by forming compound semiconductor devices on a silicon wafer substrate have been made.

However, it is difficult to produce a GaAs layer having few lattice defect only by depositing GaAs on the monocrystalline silicon substrate since there is lattice misfit of about 4% between the silicon monocrystalline and GaAs monocrystalline.

In order to solve this problem, the following methods have been proposed.

(I) Method in which Ge layer is formed on a surface of a monocrystalline silicon substrate at first noticing the fact that Ge crystal has a lattice parameter almost same as that of GaAs crystal and, thereafter, GaAs layer is formed on the Ge layer (See, for example, JP-A No. 61-64119).

(II) Two steps growing method comprising the following steps:

step for growing thin GaAs layer of 100-200 Å on a surface of a monocrystalline silicon substrate at a relatively low temperature of 400°~450° C. as the first layer and step for forming the second GaAs layer at a temperature of 700°~750° C.

whereby the lattice misfit is relaxed by said first GaAs layer (See p 1 to p 6 of the material offered to the joint study session of 125-th committee and 145-th committee of the Japan Society for Promotion of Science which was held on Dec. 12, 1986).

(III) Method in which strained superlattice layers are formed on a surface of a monocrystalline silicon substrate in order to relax the lattice misfit and, thereafter, GaAs layer is formed on the strain superlattice layer (see p 12 to p 17 of the same mentioned in the item (II)).

(IV) Method in which an insulating layer of $CaF_2$ or the like is formed on a surface of a monocrystalline silicon substrate with use of the epitaxial growing method and, then, GaAs layer is formed on said insulating layer (See p 36 to p 40 of the same mentioned in the item (II)).

However, these proposed methods have various disadvantages as follows:

In the first method (I), there is a problem of auto-doping which causes deterioration in characteristics of the functional device due to doping of Ge into GaAs.

Even in the two steps growing method (II), the dislocation density in the GaAs layer has a fairly large value of $10^8$ cm$^{-2}$.

Further, in the third method (III), it is necessary to form strained superlattice layers of about ten layers and, due to this, the production process becomes complicated and takes a long time.

Also, no detailed result of research regarding the problem of the lattice misfit between the insulating layer and the GaAs layer has been reported until now.

SUMMARY OF THE INVENTION

An essential object of the present invention is to provide a production method of a compound semiconductor device being capable of depositing a compound semiconductor layer of high quality, namely having few lattice defects, on a silicon wafer having an excellent crystalline structure.

In order to accomplish the object of the present invention, there is provided a production method for producing a semiconductor device by growing a crystalline compound semiconductor for forming a functional device on a surface of a substrate of monocrystalline silicon comprising the following steps: step for forming a transition domain for terminating misfit dislocation caused upon the crystalline growth of said compound semiconductor which varies from monocrystalline silicon to polycrystalline silicon in the direction of depth of said substrate when seen from said surface thereof, said transition domain being formed by implanting oxygen ions into said monocrystalline substrate, and annealing said implanted substrate to form a buried oxidized silicon ($SiO_2$) leaving a monocrystalline silicon layer between said buried $SiO_2$ layer and said surface of said substrate and step for depositing a compound semiconductor layer on said surface of said substrate.

The present invention is made as an application of so called SIMOX (Separation by Implanted Oxygen) technique wherein a buried $SiO_2$ layer is formed beneath the surface of a monocrystalline silicon substrate by implanting oxygen ions into the substrate and the monocrystalline silicon layer remaining above the buried $SiO_2$ is utilized as an active domain for forming one or more functional devices thereon.

This SIMOX technique is noticed as technique for isolating devices of the large scaled integrated circuit such as CMOS or as a production method of a semiconductor device suitable for mounting on an artificial satellite which is exposed to cosmic rays.

In this SIMOX technique, the monocrystalline silicon layer existing above the buried $SiO_2$ layer is formed so as to have a thickness of an order of several thousands Å in order to use it as an active domain for forming functional devices. In other words, conditions for implanting oxygen ions are chosen so as to be able to form the buried $SiO_2$ layer at a depth such that the silicon layer thereabove can have the thickness mentioned above.

When oxygen ions are implanted into the monocrystalline silicon substrate in order to form the buried $SiO_2$ layer, a transition domain wherein $SiO_2$ grains and $SiO_x$ ($x<2$) are coexisting is formed between the buried $SiO_2$ layer and the monocrystalline silicon layer. Namely, when seen in the direction of depth from the surface of the monocrystalline silicon substrate, the monocrystalline silicon layer, the polycrystalline silicon layer and the SiO₂ layer are formed successively and the boundary between the monocrystalline silicon layer and the polycrystalline silicon layer is formed as the twinning plane. The twinning plane and the polycrystalline silicon layer form the transition layer.

The inventors of the present invention noticed the fact that the substrate produced according to SIMOX technique has the twinning plane at the boundary between the monocrystalline silicon layer and the polycrystalline silicon layer and the domain including the twinning plane is effective for terminating dislocations due to the misfit between two crystals.

The present invention utilizes this structure mentioned above.

Namely, when a compound semiconductor such as GaAs is formed on a thin monocrystalline silicon layer beneath which a transition domain including a twinning plane and a polycrystalline silicon layer, misfit dislocations generated during the growth of crystal are terminated in the transition domain, and, therefore, lattice defects in the compound semiconductor such as GaAs are reasonably reduced.

According to the present invention, dislocations due to the misfit between two crystalline lattices are relaxed or absorbed in the transition domain due to the heat applied to the substrate during the growth of the compound semiconductor and the annealing treatment.

This enables to produce a high performance composite integrated circuit including various compound semiconductor devices as light emitting devices or light receiving devices together with crystalline silicon semiconductor devices.

BRIEF DESCRIPTION OF DRAWINGS

These and other objects and features of the present invention will become more apparent when the preferred embodiment of the present invention is described in detail with reference of accompanied drawings in that.

DETAILED DESCRIPTION OF THE PREFERRED EMBODIMENT

At first, a monocrystalline silicon substrate 1 is prepared as a substrate of a semiconductor device to be produced.

Figure 1:
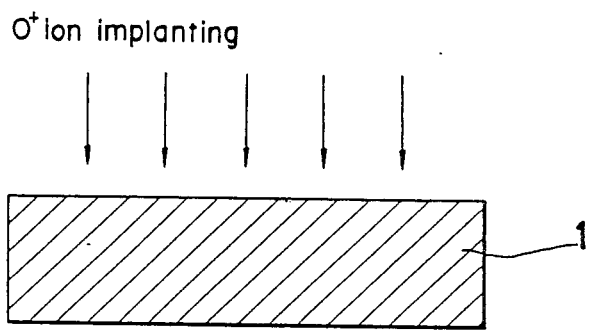
FIGS. 1, 2 and 3 are explanatory views for showing steps for producing a semiconductor device according to the present invention.
Figure 2:
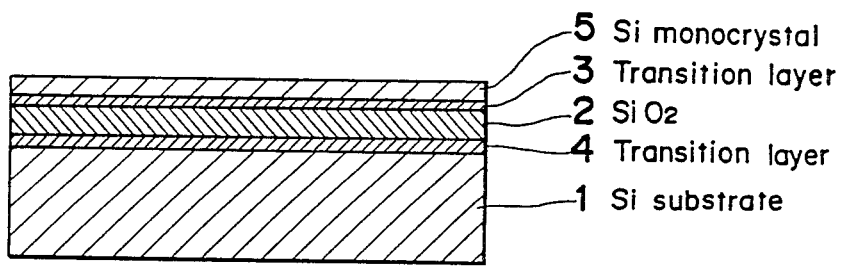

Oxygen ions are implanted into the silicon substrate 1 from the surface thereof in large quantities with use of the ion implanting method, as shown in FIG. 1.

After the ion implanting, a buried SiO₂ layer 2 is formed beneath the surface of the silicon substrate 1 therein by annealing it.

Transition layers 3 and 4 having a ratio of oxygen to silicon (O/Si) smaller than 2 are formed on and below the buried SiO₂ layer (O/Si=2). In this transition layer, small grains of SiO₂ and SiOx (x<2) coexist in the mixed state.

Conditions for implanting oxygen ions and conditions for annealing the silicon substrate 1 are suitably chosen, according to SIMOX technique, so as for a thin monocrystalline silicon layer 5 to remain on the upper transition layer 3. The thickness of the monocrystalline silicon layer 5 can be controlled by selecting an acceleration voltage to be applied upon the ion implanting and a dose amount of oxygen ion suitably. The thickness of the monocrystalline silicon layer 5 is desirably controlled so as to be thinner than one thousand Å.

If it is thicker than one thousand Å, it becomes difficult to terminate or absorb dislocations caused during the growth of a compound semiconductor by the transition layer 3 effectively.

Figure 3:
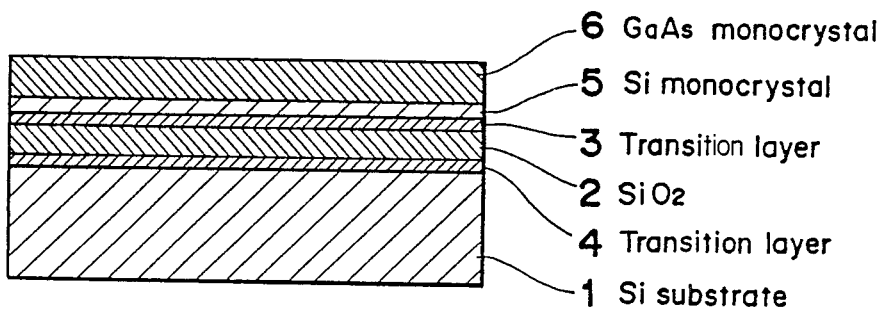

Next, a monocrystalline GaAs layer 6 is deposited as a compound semiconductor on the monocrystalline silicon layer 5, as shown in FIG. 3. As the growing method of the monocrystalline GaAs layer 6, various epitaxial growth methods such as MBE (Molecular beam epitaxy), MOCVD (Metal organic chemical vapor deposition), VPE (Vapor phase epitaxy), LPE (Liquid phase epitaxy), ECR (Electron cyclotron resonance) and the like can be employed.

According to the production method of the present invention, lattice misfits caused between the monocrystalline silicon layer 5 and the monocrystalline GaAs layer 6 in the early stage of the growth of the latter can be reduced considerably by the heat applied to these layers during the growth and/or by an annealing treatment to be performed after the growth.

As mentioned already, this phenomenon is considered to be based on the fact that the transition domain including the transition layer 3 and the twinning plane as the boundary between the transition layer 3 and the SiO₂ layer 2 serve as the domain which can terminate or absorb almost of all misfit dislocations caused in the monocrystalline GaAs layer 6 and, therefore, the generation of lattice defects therein is well suppressed.

Although the present invention is somewhat similar to the known SIMOX technique, the former is different from the latter in the following points:

(a) The monocrystalline silicon layer 5 is controlled so as to have a thickness thinner than 1,000 Å in the present invention while it is controlled to have a thickness equal to or thicker than several thousands Å in the latter.

(b) The present invention forms the compound semiconductor device directly on the monocrystalline silicon substrate.

(c) SIMOX technique utilizes the monocrystalline silicon layer remaining on the buried SiO₂ layer as an active domain for forming functional devices.

(d) On the contrary, the present invention utilizes the monocrystalline silicon layer 5 and the transition layer 3 between the layer 5 and SiO₂ layer 2 as a domain for absorbing or relaxing misfit dislocations caused in the compound semiconductor upon the growth thereof.

The diameter of a wafer of monocrystalline GaAs is about 3 inches at the most and the price thereof is very high when compared with that of a silicon wafer. This is due to the reason that there are various problems to be solved in the growing technique for growing a bulk GaAs.

According to the present invention, it becomes possible to produce a wafer having a monocrystalline GaAs layer supported by a silicon wafer which can have a relatively large diameter at a low cost.

Though the GaAs wafer itself is very fragile, the wafer produced according to the present invention has a reasonable mechanical strength since it is supported by the silicon wafer.

It is to be noted that lattice defects can be reduced effectively if the two steps growing method as mentioned above is employed for growing the monocrystalline GaAs layer 6.

As the compound semiconductor, a compound of groups III-V such as InP, GaAlAs or the like or a compound of groups II-VI such as ZnSe or the like can be utilized other than GaAs.

Further, by utilizing both of the present invention and SIMOX technique, it becomes possible to realize a multifunctional composite semiconductor device having at least one silicon semiconductor device and at least one compound semiconductor device.

The preferred embodiments described herein are illustrative and not restrictive, the scope of the invention being indicated by the appended claims and all variations which come within the meanings of the claims are intended to be embraced herein.

What is claimed is:

1. A production method for producing a semiconductor device by growing a crystalline compound semiconductor for forming a functional device on a surface of a substrate of monocrystalline silicon comprising the following steps:

step for forming a transition domain for terminating misfit dislocation caused upon the crystalline growth of said compound semiconductor which varies from monocrystalline silicon to polycrystalline silicon in the direction of depth of said substrate when seen from said surface thereof, said transition domain being formed by implanting oxygen ions into said monocrystalline substrate, and annealing said implanted substrate to form a buried oxidized silicon ($SiO_2$) leaving a monocrystalline silicon layer between said buried $SiO_2$ layer and said surface of said substrate; and step for depositing a compound semiconductor layer on said surface of said substrate.

2. A production method as claimed in claim 1, wherein said compound semiconductor is a compound semiconductor of groups III-V.

3. A production method as claimed in claim 2, wherein said compound semiconductor of groups III-V is a GaAs monocrystalline semiconductor.

4. A production method as claimed in claim 1, wherein said compound semiconductor is a compound semiconductor of groups II-VI.

5. A production method as claimed in claim 1, wherein the thickness of the monocrystalline silicon layer left between said surface and the polycrystalline silicon layer is controlled so as to be thinner than 1,000 Å.

6. A production method as claimed in claim 1, further includes step for annealing the substrate after depositing said compound semiconductor thereon.

* * * * *